United States Patent [19]
Kan

[11] Patent Number: 5,218,293
[45] Date of Patent: Jun. 8, 1993

[54] PASSIVE HIGH-FREQUENCY SIGNAL PROBE

[76] Inventor: David T. Kan, 4120 Exultant Dr., Rancho Pales Verdes, Calif. 90274

[21] Appl. No.: 752,731

[22] Filed: Aug. 30, 1991

[51] Int. Cl.$^5$ .................... G01R 1/073; G01R 31/02
[52] U.S. Cl. .......................... 324/158 P; 324/158 F
[58] Field of Search ............... 324/158 P, 158 F, 72.5

[56] References Cited

U.S. PATENT DOCUMENTS

| | | | |
|---|---|---|---|
| 3,054,078 | 9/1962 | Baschkin | 339/18 |
| 3,551,878 | 12/1970 | Rossman | 339/75 |
| 3,587,029 | 7/1971 | Knowles | 339/14 |
| 3,778,754 | 12/1973 | Takahashi et al. | 339/176 |
| 3,829,818 | 8/1974 | Iosue et al. | 339/19 |
| 3,880,493 | 4/1975 | Lockhart, Jr. | 339/147 |
| 3,968,433 | 7/1976 | Dobarganes | 324/158 |
| 4,030,793 | 6/1977 | Hanlon et al. | 339/19 |
| 4,055,806 | 10/1977 | Patel | 324/158 |
| 4,222,626 | 9/1980 | Hollyday et al. | 339/147 |
| 4,326,765 | 4/1982 | Brancaleone | 339/17 |
| 4,419,626 | 12/1983 | Cedrone et al. | 324/158 |
| 4,428,633 | 1/1984 | Lundergan et al. | 339/17 |
| 4,478,476 | 10/1984 | Jones | 339/147 |
| 4,689,556 | 8/1987 | Cedrone | 324/158 P |
| 4,749,362 | 6/1988 | Hoffman et al. | 439/269 |
| 5,014,002 | 5/1991 | Wiscombe et al. | 324/158 |

OTHER PUBLICATIONS

Brochure of ITT Pomona Electronics, "Surface Mount Device Interconnects", pp. 14-18 and 413-416.

Brochure of Scanbe Manufacturing Corporation, "Dual Inline Packaging", pp. 6 and 9.

Primary Examiner—Ernest F. Karlsen
Attorney, Agent, or Firm—Christie, Parker & Hale

[57] ABSTRACT

A logic probe system for an integrated circuit device under test, such as a dual in-line package (DIP) device having a plurality of spaced-apart signal pins, comprises a probe header, including a plurality of signal contacts, and a plurality of ground contacts in the probe header body. The signal contacts each include a spring contact for tightly coupling the signal contact to the pins of the device under test, and a pin end protruding from the header body. The ground contacts each comprise a ground pin end protruding upwardly from the header body, and a distal end conductively secured to a ground plane extruding through the header body. An attenuator clip couples one of the signal pins and an adjacent ground pin to an external measuring device in series with a fixed-value resistor. The signal contacts preferably are arranged in parallel rows proximate to the side edges of the header body. The ground contacts are likewise arranged in a second, inboard spaced-apart pair of rows. The attenuator comprises a fixed-value resistor coupled in series with an input socket and an output pin and a ground conductor extending therethrough. The invention further provides a method for testing an integrated circuit, using the device described above, wherein the device is secured to a device under test and coupled using the attenuator clip to a measuring device.

14 Claims, 5 Drawing Sheets

PASSIVE HIGH-FREQUENCY SIGNAL PROBE

FIELD OF THE INVENTION

The present invention generally relates to apparatus and methods for high-frequency, controlled-impedance testing of integrated circuits while the circuits are installed in a circuit board. The present invention specifically relates to testing methods and systems comprising a pin extension header snugly fitting over a device under test, and an attenuator clip for directly coupling a controlled-impedance measurement system to a plurality of extended pins on the header and to a ground plane therein.

BACKGROUND OF THE INVENTION

Integrated circuits ("ICs" or "chips") are widely used in complex electrical an electronic applications where reliability is essential. Testing the chips while they are attached to or soldered in a circuit board is often necessary. However, due to the small, compact nature of these chips, the testing of ICs with dozens of pins is often a tedious process.

Two types of passive voltage probes, high-resistance probes and low-resistance probes, presently exist in the prior art to test integrated circuits.

The high-resistance probes are limited to a 300-400 MHz IC signal bandwidth, due to high impedances, and are designed to interface with oscilloscopes or other measuring systems typically having 1MΩ inputs. These high impedance probes generally have an input capacitance of 10 pf. The low-resistance and low-capacitance probes can sense signals with bandwidths exceeding several GHz and are designed to interface with 50Ω inputs. In such a probe, the acquired signal travels in a controlled-impedance environment, thereby preserving the high-frequency characteristics of the signal.

Achieving sensitivity to high-frequency signals with both types of prior art probes requires a test measurement to be made with the shortest possible distance between the probe tip and the signal, and also a very short distance between the probe tip and the probe ground lead. Due to the nature of the probe construction, a relatively long ground lead is usually present, unless the probe is inserted into a specially designed probe socket, at a fixed point on the circuit board. Thus, it is seldom possible to use a probe socket unless a specialized test point was included in the circuit board design. Also, to test a plurality of IC signals, the probe must be separately attached to each pin under test, a very slow process.

U.S. Pat. No. 4,749,362 discloses a device that clips or clamps onto a dual in-line package (DIP) IC. The clip has contacts which are pressed against the IC pins and are coupled to extended pins on top of the DIP clip. A probe is attached to the clip pins for monitoring signals of the IC. The ground lead of the probe is connected to the ground pin of the IC, usually (but not always) located the left lower corner pin of the IC. Although the clip conveniently attaches to a DIP IC, the arrangement is not suitable for high-frequency measurement because the distance from an IC pin to the probe tip is relatively long. The ground return path is also very long. As a result, to the measurement system the signal path looks inductive, and the measured wave forms are distorted. In extreme cases, high frequency, narrow pulse signals are lost altogether. In many high-speed digital circuits, a 10 pf circuit loading together with the inductive component of the probe can produce very undesirable results, including overshoot, ringing and oscillation. In the case of very narrow pulses, a 10 pf loading can make the signal disappear all together. In contrast, loading by a low-resistance and low-capacitance probe in the 500Ω to 5KΩ range with less than 1 pf capacitance often produces negligible effects, so low-resistance low-capacitance probes are highly desirable.

U.S. Pat. No. 4,419,626 provides a means capacitively offsetting the distortion, but it uses a complex circuit requiring inductors and capacitors.

Low-resistance probes can be connected to 50Ω transmission line systems, enabling the acquired signals to be easily processed through high-speed scanners, attenuators, and digitizing systems for automatic measurements. On the other hand, it is virtually impossible to multiplex high-frequency signals through high-resistance circuits. That is, it is very difficult to build a stand alone high-frequency and high-impedance attenuator. A high-input impedance amplifier is normally required to capture the signal from the attenuator output.

Thus, those of ordinary skill in the art would find desirable a controlled-impedance integrated circuit test system for testing integrated circuits installed in a circuit board, providing very short lead length from the test probe system to the device under test, enabling high-frequency signal measurement of a plurality of signals.

Such persons would also appreciate an easily attached and removed test probe system adapted to snugly grip an IC device under test.

Others would similarly find useful a probe system including a removable attenuation clip and a repositionable grounding jumper to enable short-length connection of a measuring device cable to a plurality of extended pins of a device under test, at a predetermined impedance matching the input impedance of the measuring device.

SUMMARY OF THE INVENTION

Accordingly, the present invention provides a logic probe system for an integrated circuit device under test, such as a dual in-line package (DIP) device having a plurality of spaced-apart signal pins. The system comprises a probe header, including a plurality of spaced-apart signal contacts, and a plurality of ground contacts mounted in the probe header body. The signal contacts preferably are arranged in parallel rows proximate to the side edges of the header body. The ground contacts are likewise arranged in a second, inboard spaced-apart pair of rows. The signal contacts each include a downwardly extending spring contact for tightly coupling the signal contact to the pins of the device under test, and a pin end protruding upwardly from the header body, enabling the header body to be snugly attached to the device under test. The ground contacts each comprise a ground pin end protruding upwardly from the header body, and a distal end conductively secured to a ground plane extending lengthwise in and through the header body. The system further includes a removable and repositionable attenuator clip for coupling one of the signal pins and an adjacent ground pin to an external measuring device in series with a fixed-value resistor. The attenuator comprises a fixed-value resistor coupled in series with an input socket and an output pin, and a separate ground conductor extending therethrough. The invention further provides a method for testing an integrated circuit, using the device described above, wherein the device is secured to a device under test and coupled using the attenuator clip to a measuring device.

Thus, the invention provides a device that can be pressed on directly over an IC to connect to every pin with very short leads, less than ¼ the lead length of prior art DIP clips. A sub-miniature resistive attenuator probe inserts into a pair of pins, connecting a measuring device to a signal pin and ground pin, which is connected to the low-impedance ground plane. The total distance that the signal must travel from the IC pin to the probe tip, which is the attenuator chip resistor, can be as short as 0.35″. The attenuator housing is made to be plugged into any set of pins, side by side or otherwise, so that all the pins of an IC can be connected to a plurality of attenuators for simultaneously testing all pins. The other end of the attenuator is connected to a standard 50Ω shielded coax cable. Using a plurality of attenuators, literally hundreds of signal points can be connected to a high-speed measurement system for automatic measurement.

BRIEF DESCRIPTION OF THE DRAWINGS

Details of the invention are described below and will be more fully appreciated with reference to the accompanying drawings.

DETAILED DESCRIPTION

In the following description, specific terminology is used for the sake of clarity. However, the invention should not be limited to the specific terms so selected, but rather includes all technical equivalents functioning in a substantially similar manner to achieve a substantially similar result.

Figure 1:
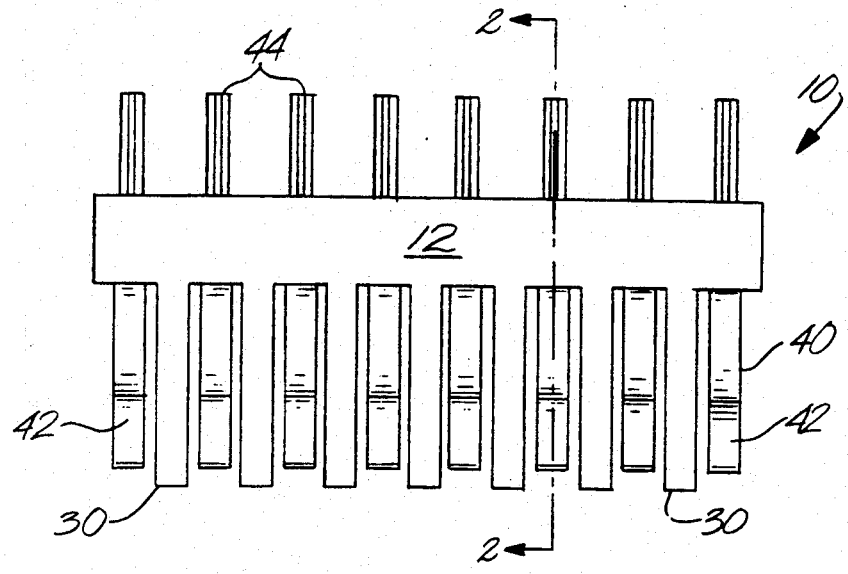
FIG. 1 is a side elevation view of a test probe header comprising a part of the invention.

Referring first to FIG. 1, one element of the system of the invention is a probe header assembly 10 for an integrated circuit device under test, such as a dual in-line packaged device (DIP), comprising a probe header body 12 with parallel rows of signal contacts 40, insulator legs 30 and ground contacts 50 (FIGS. 2, 3) protruding therefrom.

Each of the signal contacts 40 includes a spring end 42 extending downwardly from the header body for conductively coupling to the DIP contacts, and a pin end 44 extending upwardly from the header body. The spring ends are spaced apart along the header body to match the spacing of the parallel rows of pins disposed along the body of a typical DIP. The spring ends preferably are curved inwardly in an s-shape, as shown in FIG. 2, to conductively couple to the DIP pins using inward spring tension.

Figure 4:
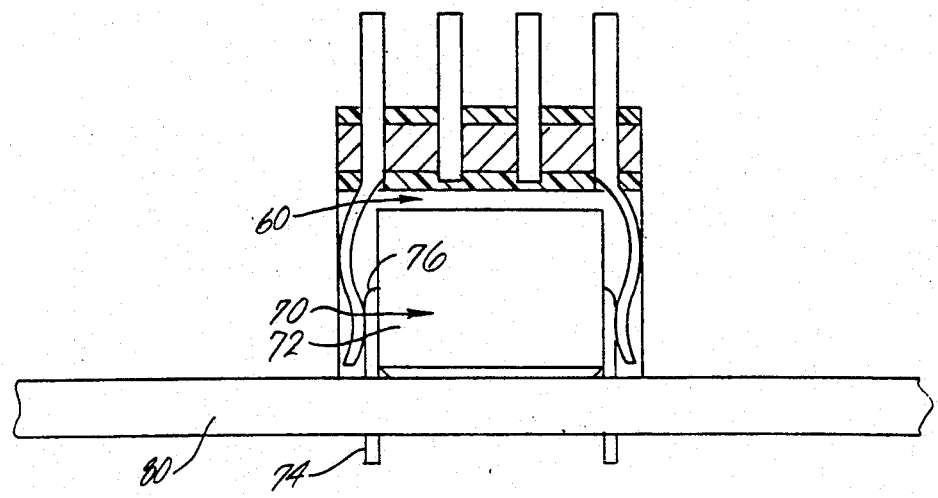
FIG. 4 is an end section view of the header of FIG. 1 coupled on an integrated circuit device under test in a circuit board.

The insulator legs 30 secure the probe header to the device under test. The legs are spaced apart between the conductive contacts (i.e., each leg is flanked by two signal contacts) for engaging the body of the DIP between the DIP signal pins, as shown in FIG. 4. An inwardly angled notched tip 32 at the lower end of each insulator leg further facilitates the snug fit and prevents upward movement of the header body. The insulator legs 30 also prevent spring ends 42 from touching the PC board 80 as seen in FIG. 4.

The ground contacts each comprise a ground pin end 50 protruding upwardly from the header body and a distal end 54 fixedly mounted to the header body.

Figure 2:
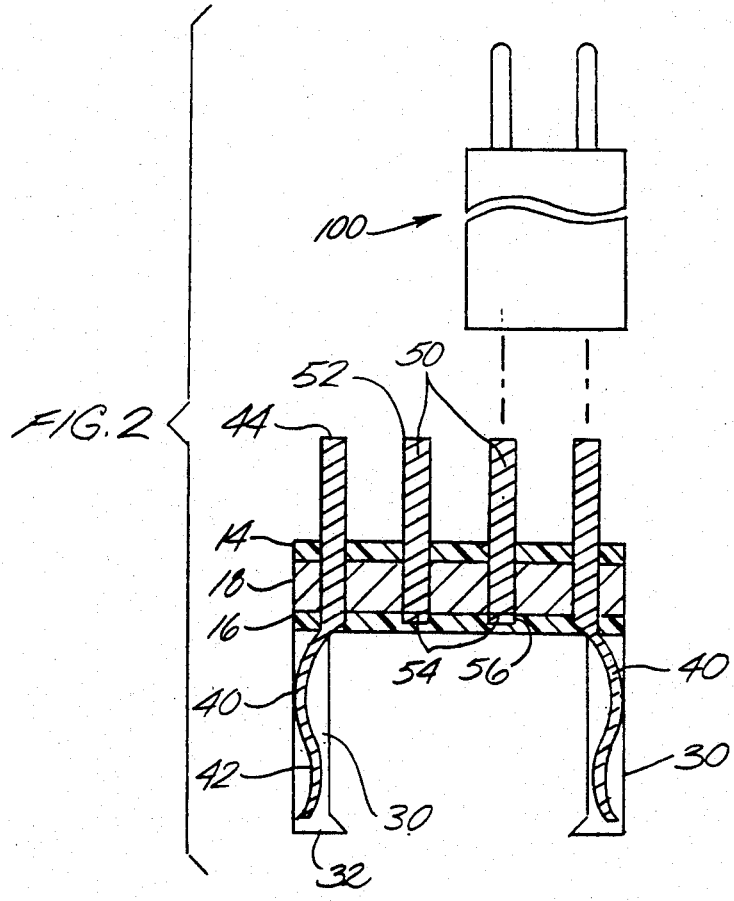
FIG. 2 is an end section view taken along line 2—2 of FIG. 1, showing the header of FIG. 1 and an attenuator clip aligned therewith.

Referring to FIG. 2, the header body comprises an upper plate 14 and a lower ground plate 16 with a prewired circuit board 18 contained between the plates. The spring ends 42 pass through holes in the upper and lower plates and holes 15 in the circuit board without a conductive coupling to or contact with the plates, and are conductively attached to the signal pins 44. Each ground pin of the two rows of ground contacts is conductively coupled to the lower ground plate via ground foil 56 on the bottom plate, best seen in FIG. 3B, so that the rows of ground pins electrically form a ground plane. In use, one signal pin (corresponding to the ground signal pin of the DIP) is connected to the ground plate via a micro jumper or micro shunt (not shown). Thus, the micro jumper causes every ground pin to be effectively held at the ground potential of the IC under test.

The plates and circuit board can be secured using adhesive or using plastic pins extending through the plates. Ground foil 56 can be placed on plates 14, 16 or the circuit board as a matter of design choice.

Figure 3A:
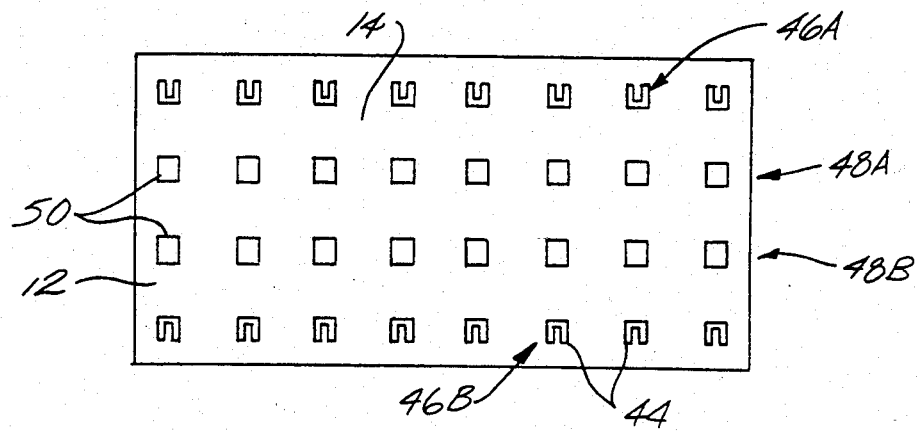
FIG. 3A is a top plan view of the header of FIG. 1.
Figure 3B:
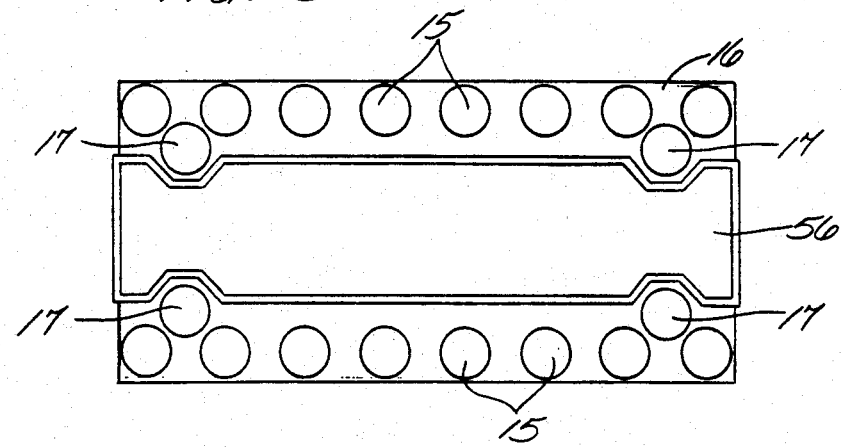
FIG. 3B is a plan view of a ground plate of the header.

Referring to FIGS. 3A and 3B, four parallel rows of pins including two rows of ground pins 48A, 48B surrounded by the two rows of signal pins 46A, 46B protrude upwardly from the probe header body 12. Each row of signal pins is disposed along the header body proximate to the lengthwise side edges of the body; the ground pins are located inward of the signal pins. The parallel rows provide for equidistant spacing between each individual signal pin and its adjacent ground pin. This equidistant spacing between each signal pin and ground pin pair allows the accommodation of an attenuator clip 100, to be discussed subsequently, and also matches pin spacing of typical ICs.

FIG. 4 shows the probe header assembly attached to a conventional DIP IC 70 mounted on a circuit board 80. The DIP pins 74 protrude outwardly from the sides of the DIP body and bend downwardly therefrom at an upper shoulder 76. Although the probe header fits snugly on the DIP using the insulator legs and the spring contacts, the probe body itself preferably does not contact the DIP body. Instead an air gap 60 exists between the DIP body and probe body to prevent inadvertent jarring of the DIP pins from the circuit board due to the weight of the probe header assembly.

Figure 5:
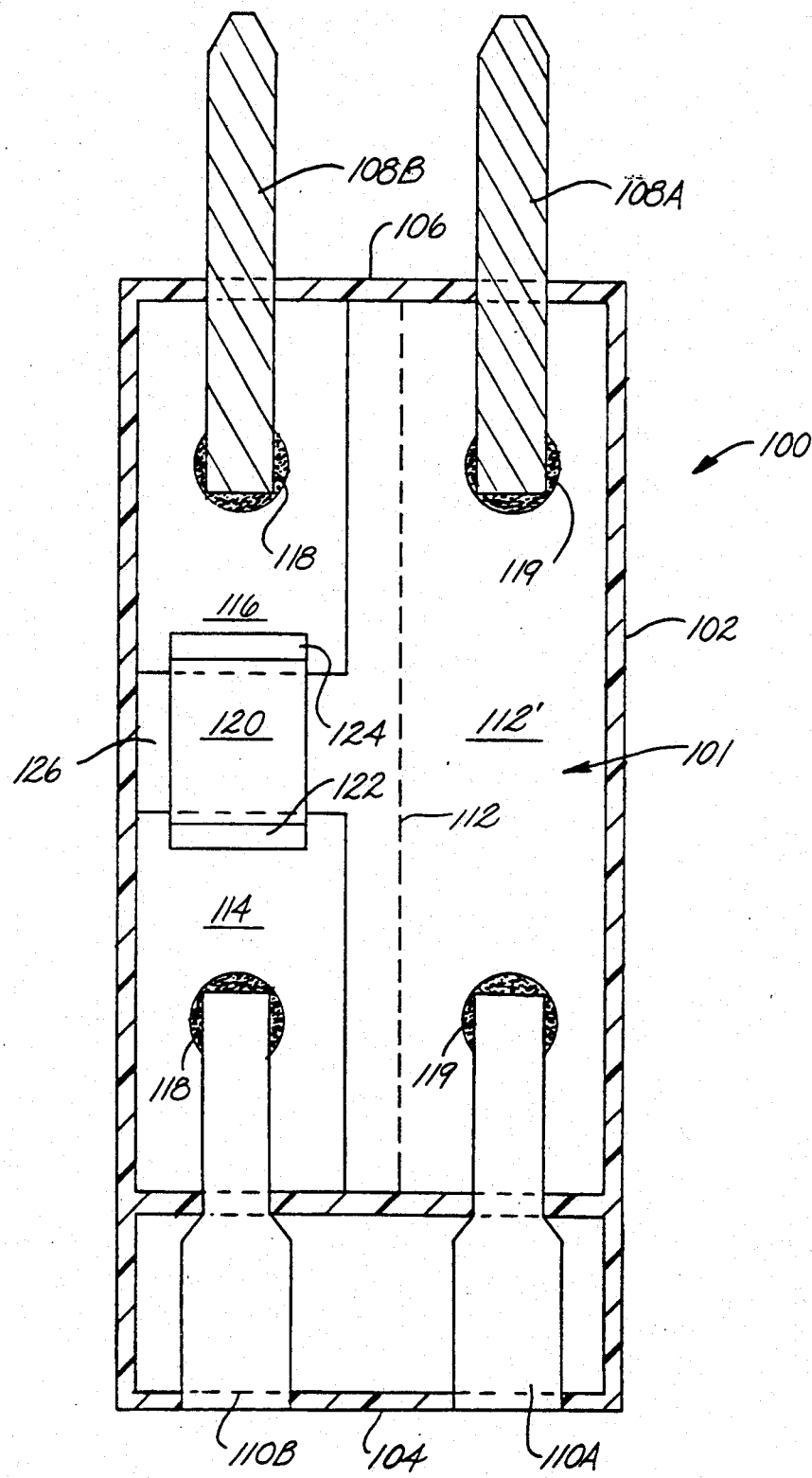
FIG. 5 is a side section view of the interior components of the attenuator of FIG. 2.
Figure 6:
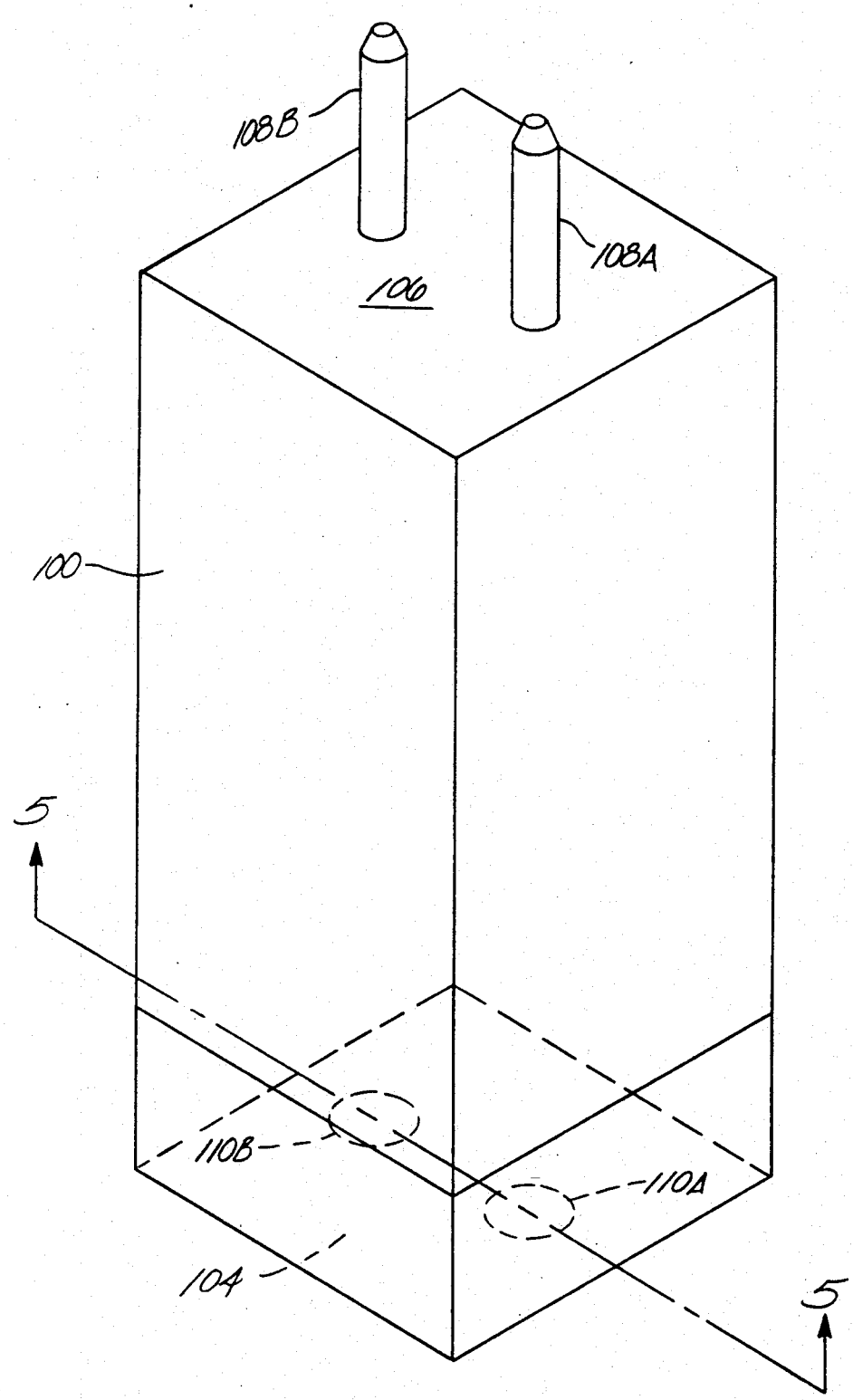
FIG. 6 is a perspective view of the attenuator of FIGS. 2 and 5.

Referring to FIGS. 2, 5, and 6, the attenuator clip 100 provides a means to couple one ground pin and one ground contact from the probe header body to an external measuring device. To achieve this, the clip comprises a generally rectangular attenuator housing 102 having top and bottom walls 104, 106. First and second input sockets 110A, 110B protrude inwardly into the bottom wall of the housing and electrically couple to corresponding first and second output pins 108A, 108B protruding upwardly from the top wall of the housing. The electrical coupling can be done on a circuit board 101 in the clip using conductive foil strips or fine-gauge wire. The input sockets, adapted for standard 0.025" sq. pins, are formed to couple with one signal pin and one adjacent ground pin on the header body. The output pins from the clip are formed to adapt to a conventional 50Ω coaxial cable connector of an oscilloscope or other test instrument.

Referring to FIG. 5, within the attenuator clip, the ground socket 110A is connected in series with the corresponding output pin 108A via plated-through holes 119 a conductive metal ground plane on the underside of a printed circuit board 101 in the clip. The location of the ground plane is defined by area 112' and phantom line 112. The signal socket 110B, adjacent to the ground socket 110A, is connected in series with the corresponding output signal pin 108B on circuit board 101 via lower signal path metal 114 and upper signal path metal 116 both attached to a miniature resistor chip 120. The resistor chip typically is a 450Ω fixed resistor of conventional material and structure. The lower signal path metal is attached to the resistor chip through a lower resistor contact 122. The upper end of the resistor chip is attached to an upper signal path metal 116 through an upper resistive contact 124. The top end of the upper signal path metal is soldered to a second output socket 108B which serves as the signal contact between the DIP and the measuring device. Thus, the resistor chip is electrically located in series with pin 108B and socket 110B. The widths of the metal paths 114, 116 are chosen so that, with the ground plane on the opposite side of the printed circuit board, the paths exhibit a characteristic impedance of the desired value, such as 50Ω.

Figure 7A:
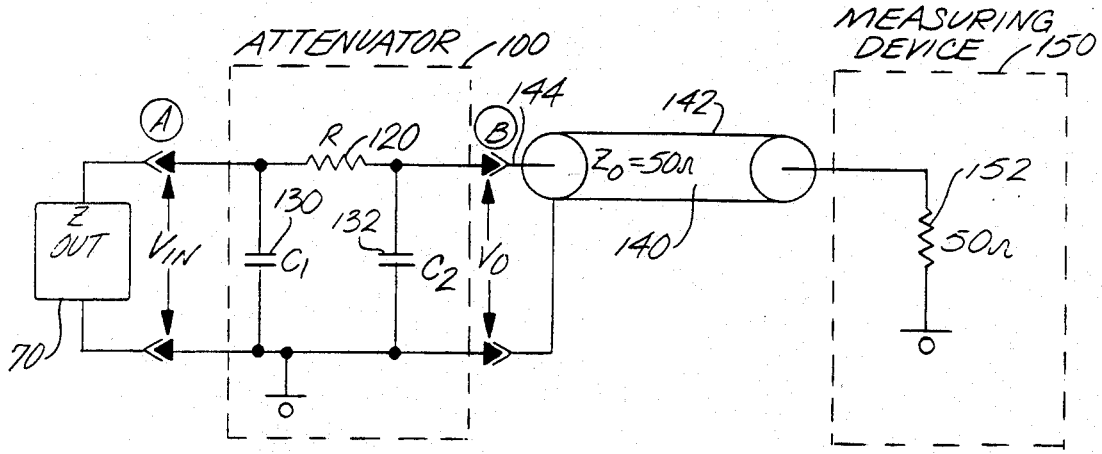
FIG. 7A is a schematic circuit diagram of a measurement system using the header of FIG. 1 and the attenuator of FIGS. 2 and 5.
Figure 7B:
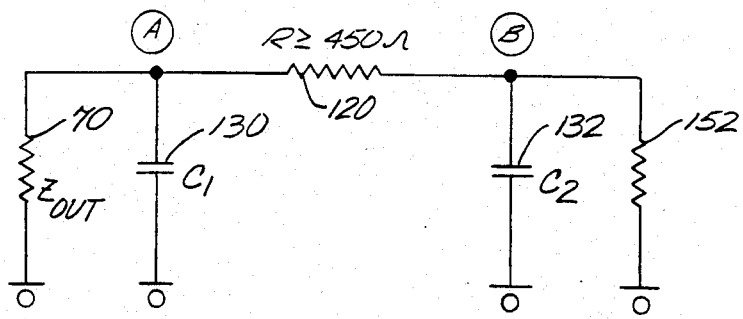
FIG. 7B is a simplified representation of the diagram of FIG. 7A.

Referring to FIG. 7, the attenuator clip provides a means for impedance matching the signal outputs of the DIP to the inputs of a conventional 50Ω measuring device. The physical separation between the lower signal path metal 114 and the metal ground plane form capacitor $C_1$ 130 and the physical separation between the upper signal path metal 116 and the metal ground plane form capacitor $C_2$ 132 (See FIG. 5). Typical values of the capacitors are 0.7 pf. The output impedance Zout from the DIP 70 sets up an input voltage Vin across the attenuator circuit. Resistor chip 120, connected in series with the DIP along with capacitors $C_1$ and $C_2$ attenuates the DIP output voltage before it is passed into the 50Ω coax cable 140. More specifically, the signal acquired at point A is attenuated at point B by $V_o = [50\Omega/(R+50)]$ Vin. From point B onward, the signals are passed through controlled-impedance environments effectively preserving the high frequency characteristics of the signal. The low input impedance environment comprises a conventional coaxial cable 14 encased in a grounded shield 142 and coupled to the measuring device 150 containing a 50Ω resistor.

Thus, the probe system of the invention provides a test device with very short leads. In the preferred embodiment, the distance of a signal from a DIP pin to the attenuator is 0.35". The short leads preserve the high frequency signals from the DIP. Moreover, the attenuator clip is designed so that all the pins of an IC can be simultaneously connected to a plurality of similar attenuators. Using a plurality of attenuators and coax cables, literally hundreds of signal points can be connected to a high speed measuring device for automatic batch processing.

The invention provides a device that is pressed on directly over an IC and makes connections to every pin with very short leads, less than ¼ the lead length of prior art DIP clips. A sub-miniature resistive attenuator probe inserts into a pair of pins, connecting a measuring device to a signal pin and ground pin, which is connected to the low-impedance ground plane. The attenuator housing can be made to be plugged into any set of pins, side by side or otherwise, so that all the pins of an IC can be connected to a plurality of attenuators for simultaneously testing all pins. The other end of the attenuator is connected to a standard 50Ω shielded coax cable. Using a plurality of attenuators, literally hundreds of signal points can be connected to a high-speed measurement system for automatic measurement.

The invention can be practiced in many different embodiments and variations. For example, the number of pins in the header clip can vary according to the size of the integrated circuit under test. The device could be adapted for use with surface-mount devices, single in-line package devices, and other known integrated circuit or other electronic components. Further, the attenuator clip can be constructed in different attenuation ratios, impedance values, sizes and shapes depending on design choice. Accordingly, the invention should be given the full scope of the appended claims.

What is claimed is:

1. A logic probe system for a device under test in a circuit board, the device under test having a plurality of spaced-apart signal pins arranged in at least one row and secured in the board, the system comprising:
   (a) a probe header including a plurality of spaced-apart signal contacts and a plurality of spaced-apart ground contacts mounted in a probe header body, the signal contacts being arranged in at least one row parallel to the at least one row of signal pins, each signal contact aligned in proximity to a corresponding signal contact, each signal contact including downwardly extending spring contact means for coupling to the signal pins, and a signal pin end protruding upwardly from the probe header body, and the ground contacts being arranged in at least one row parallel to the at least one row of signal contacts, each ground contact comprising a ground pin end protruding upwardly from the probe header body and a distal end conductively secured to a ground plane embedded in the probe header body;
   (b) means for press-fit attachment of the probe header over the device under test;
   (c) a detachable signal clip for coupling one of the signal contacts and an immediately adjacent one of the ground contacts to an external measuring device; and
   (d) a detachable conductive clip for coupling one of the signal contacts to one of the ground contacts.

2. The system of claim 1 wherein the signal contacts are arranged in a first spaced-apart plurality of parallel rows proximate to side edges of the header body.

3. The system of claim 2 wherein the ground contacts are arranged in a second spaced-apart plurality of parallel rows between the first parallel rows.

4. The system of claim 1, wherein the means for securing the probe header to the device under test comprises a plurality of spaced apart insulator legs extending downwardly from the probe header body, each of the insulator legs adjacent to one of the spring contact means.

5. The system of claim 4 wherein the insulator legs comprise an inwardly angled notched tip to snugly grip the body of the device under test.

6. The system of claim 1 wherein the device under test is a dual in-line package integrated circuit device and wherein the signal contacts are arranged in two parallel rows in vertical alignment with the signal pins of the device, and wherein the ground contacts are aligned in two parallel rows between the rows of signal contacts.

7. The system of claim 1 wherein the conductor is conductively secured to one of the signal contacts corresponding to the ground signal pin of the device under test whereby one of the ground contacts of the probe header conductively connects the ground signal pin of the electronic device to the ground plane in the probe header body.

8. The system of claim 6, wherein the signal clip comprises two spaced-apart input sockets and two output pins, the input sockets aligned to mate with one of the signal contacts and on e of the ground contacts, a resistor coupled in series with the first input socket and the first output pin; and a ground conductor.

9. The system of claim 8, wherein the resistor measures 450 ohms.

10. A logic probe system for a dual in-line package device under test installed in a circuit board, the device under test having a plurality of spaced-apart signal pins, the system comprising:

(a) A probe header including a plurality of spaced-apart signal contacts and a plurality of spaced apart ground contacts mounted in a probe header body, the signal contacts forming first and second parallel spaced-apart rows proximate to side edges of the probe header body, each signal contact including a downwardly extending spring contact adapted to cooperate simultaneously with one of the signal pins of the device under test, and a pin end extending upwardly from the probe header body;

the ground contacts forming two adjacent parallel spaced-apart rows between the rows of signal contacts, each ground contact comprising a ground pin end protruding upwardly from the probe header body between the first and second parallel rows of signal contacts, and a distal end conductively secured to a ground plane embedded in the probe header body;

(b) a securing means for holding the probe header onto the device comprising two interspaced rows of notched legs protruding downwardly from the probe header body between the spring contacts; and (c) an attenuator means for impedance matching the electronic device to an external measuring device, the attenuator means comprising a removable clip with upper and lower ends wherein the upper end includes first and second adjacent protruding output pins coupling the clip to the external measuring device, and the lower end includes first and second spaced-apart input sockets opposite the respective output pins and coupled thereto, and wherein a resistive element is electrically coupled in series circuit relation to one of the sockets and one of the output pins.

11. The system of claim 10 wherein the output pins of the attenuator clip are adapted to fit a 50 ohm coaxial cable connector.

12. The system of claim 10 wherein a fixed-value resistor mounted in the attenuator clip is connected in series between the first input socket and first output pin.

13. The system of claim 10 wherein a ground conductor mounted in the attenuator clip connects the second input socket and second output pin.

14. The system of claim 10, wherein the first input socket of the attenuator means is adapted to fit one signal pin of the probe header and the second input socket of the attenuator means is adapted to fit an adjacent ground pin of the probe header.

* * * * *